United States Patent [19]
Nagate et al.

[11] Patent Number: 5,441,846
[45] Date of Patent: Aug. 15, 1995

[54] SYSTEM FOR PREPARATION OF LIGHT-SENSITIVE MATERIAL

[75] Inventors: Hiroshi Nagate; Kenichi Miyata, both of Shizuoka; Masahiko Tsuda, Kanagawa, all of Japan

[73] Assignee: Fuji Photo Film Co., Ltd., Kanagawa, Japan

[21] Appl. No.: 372,026

[22] Filed: Jan. 12, 1995

[30] Foreign Application Priority Data

Jan. 12, 1994 [JP] Japan .................................. 6-001767

[51] Int. Cl.⁶ .................... G03C 11/12; B65C 3/12; B31F 1/00; B32B 31/00
[52] U.S. Cl. ...................... 430/259; 156/234; 156/238; 156/446; 156/459; 156/517; 430/256; 430/260
[58] Field of Search ............... 430/256, 258, 259, 260; 156/234, 238, 446, 459, 517

[56] References Cited

U.S. PATENT DOCUMENTS 5,358,591 10/1994 Candore ...................... 430/236

*Primary Examiner*—Richard L. Schilling
*Attorney, Agent, or Firm*—Sughrue, Mion, Zinn, Macpeak & Seas

[57] ABSTRACT

A system for the preparation of a light-sensitive material comprising a substrate, a light-sensitive layer and a base film which comprises a roller for providing a continuous light-sensitive sheet comprising the base film, the light-sensitive layer and a protective film; means for cutting the light-sensitive layer and protective layer in the traverse direction; fixing means for temporarily fixing the sheet; a roller for providing an adhesive tape for removing the protective film; the adhesive tape-collecting roller; a bar for pressing the adhesive tape by its tip to the front end of the light-sensitive sheet and to press the front end against the bottom of the fixing means and peeling the protective film from the sheet; a dancer roll; light-sensitive sheet cutting means; substrate supplying means; and heat rollers for laminating the base film and light-sensitive layer on the substrate.

4 Claims, 6 Drawing Sheets

SYSTEM FOR PREPARATION OF LIGHT-SENSITIVE MATERIAL

FIELD OF THE INVENTION

The present invention relates to a system for the preparation of a light-sensitive material comprising a substrate, a light-sensitive layer and a cover film in order.

BACKGROUND OF THE INVENTION

A Light-sensitive material comprising a substrate (e.g., rigid substrate such as glass plate or hard resin plate) and a light-sensitive layer (e.g., light-sensitive resin layer) is employable for producing a circuit printed bard or a color filter. Such light-sensitive material is generally preparedly the use of a continuous light-sensitive sheet comprising a base film, a light-sensitive layer and a protective film, and a substrate. In more detail, the protective film is first peeled from the light-sensitive layer, and the exposed light-sensitive layer (together with the base film) is placed under heating on a series of the supplied substrates, and finally the light-sensitive layer as well as the base film are cut between the substrates to give plural light-sensitive materials having substrate, light-sensitive layer and base film (which serves as cover film).

In the practical use, the light-sensitive material is imagewise exposed to light after removal of the cover film, and developed to form a pattern of hardened resin on the substrate.

An improved process for preparing the light-sensitive material is described in our copending U.S. Pat. application No. 08/286,457 .

SUMMARY OF THE INVENTION

The present invention has an object to provide an improved system for the preparation of a light-sensitive material using a substrate and a continuous light-sensitive sheet which comprises a base film (or cover film), a light-sensitive layer and a protective film.

Specifically, the invention provides an improved system which enables to smoothly remove the protective film from the continuous light-sensitive sheet in the process for the preparation of a light-sensitive material.

In another aspect, the invention provides an improved process which requires only a minimum length of an adhesive tape to remove the protective film from the continuous light-sensitive sheet.

The invention provides a system for the preparation of a light-sensitive material comprising a substrate, a light-sensitive layer and a cover film in order which comprises:

- a roller for providing a continuous light-sensitive sheet comprising a base film (which will serve as the cover film in the light-sensitive material), the light-sensitive layer and a protective film;
- means for cutting the light-sensitive layer and protective layer in the direction traversing the continuous light-sensitive sheet which is supplied by the roller;
- fixing means for temporarily fixing thereto the continuous light-sensitive sheet, said means having a heater at its bottom and being capable of going up and down;
- a roller for providing an adhesive tape for removing the protective film from the continuous light-sensitive sheet;
- a roller for collecting the adhesive tape which has been employed for removing the protective film;
- a bar which is movable for pressing by its tip the adhesive tape to the front end of the continuous light-sensitive sheet so as to press the front end of the sheet against the bottom of the fixing means lid for withdrawing to peel the protective film from the light-sensitive sheet;
- a dancer roll which is arranged to be in contact with the adhesive tape on the path between the tip of bar and the collecting roller;
- a cutter for cutting the light-sensitive sheet in the direction traversing the continuous light-sensitive sheet which is supplied by the fixing means;
- means for supplying the substrate to the position below the fixing means; and
- heat rollers for laminating the base film and light-sensitive layer on the substrate.

In the above system, the means for cutting the light-sensitive layer and protective layer preferably comprises a disc cutter and a means for temporarily keeping the light-sensitive sheet thereon.

Further, the roller for collecting the adhesive tape is preferably capable of rolling in association with the roller for providing the continuous light-sensitive sheet.

Furthermore, the bar preferably has a tip of an acute angle which is to be brought into contact with the adhesive tape.

BRIEF DESCRIPTION OF THE DRAWINGS

FIG. 2 also shows the first stage of the process for preparing the light-sensitive material in the use of the system of the invention.

FIG. 6 also shows the first stage of the process in the next trial.

DETAILED DESCRIPTION OF THE INVENTION

In the system of the invention, a continuous (i.e., longitudinal) light-sensitive sheet comprises a base film (which serves as a cover film on the obtained light-sensitive material), a light-sensitive layer and a protective film. The protective film is laminated on the light-sensitive layer to keep the light-sensitive layer from damage and dusts. The base film generally has a thickness of 10 to 200 $\mu$m and is made of polyester, polypropylene, or other polymers. The light-sensitive layer generally has a thickness of 1 to 3 $\mu$m and is generally made of a photopolymerizable resist. Such light-sensitive sheet is well known in the art. If desired, a thermoplastic intermediate layer can be placed between the base film and the light-sensitive layer so as to facilitate heat adhesion of the light-sensitive layer on the substrate of the light-sensitive material. The intermediate layer can have a thickness of 10 to 50 μm and can be made of an acrylic resin or other thermoplastic resin.

Figure 1:
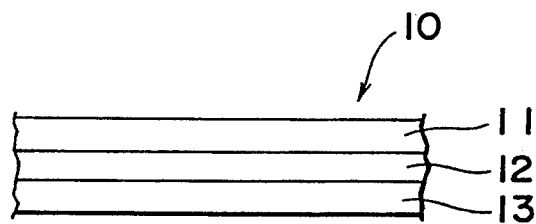
FIG. 1 shows a section of the continuous light-sensitive sheet to be employed in the invention.

FIG. 1 shows a section off the continuous light-sensitive sheet 10 which comprises a base film 11, a light-sensitive layer (e.g., light sensitive resin layer) 12, and a protective film 13.

Figure 2:
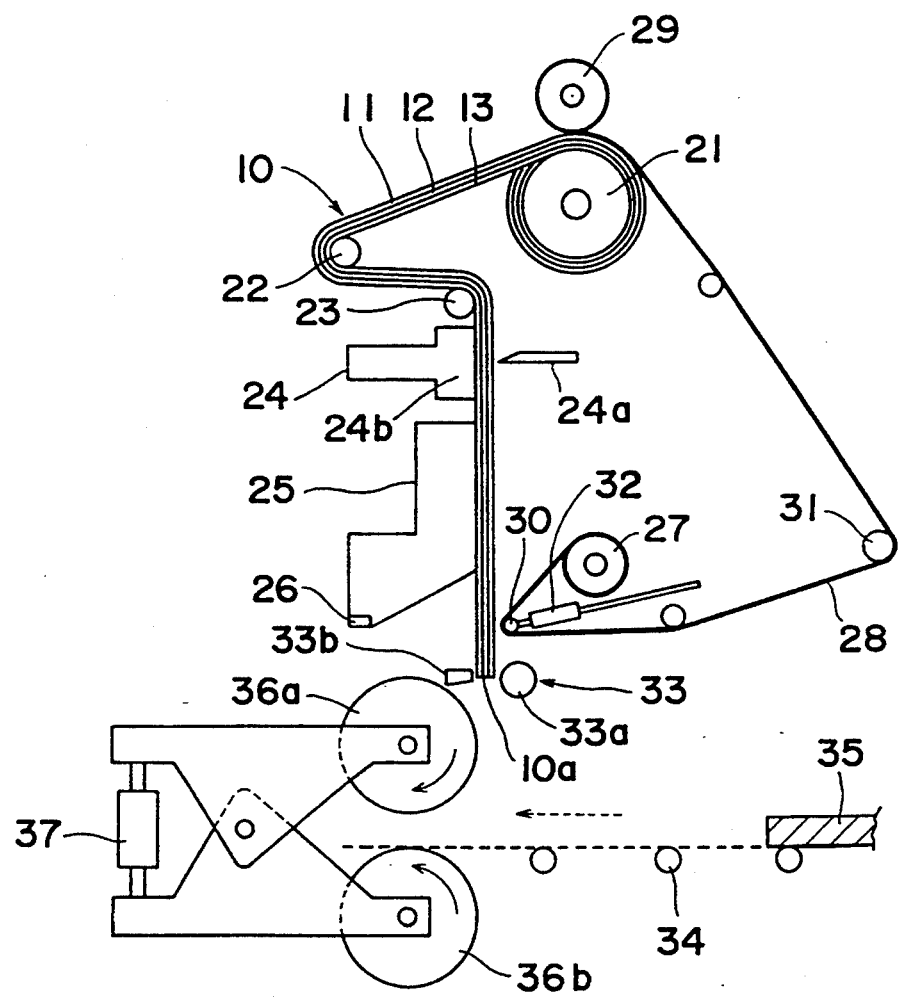
FIG. 2 shows a schematic arrangement of the system of the invention.

FIG. 2 shows an apparatus of the invention.

In the apparatus, a roller 21 is set for providing to the undermentioned laminating system the continuous light-sensitive sheet 10 of FIG. 1 which comprises the cover film (base film) 11, the light-sensitive layer 12 and the protective film 13. The cover film 11 is positioned on the outer side.

The continuous light-sensitive sheet 10 is sent to the undermentioned laminating system first by running in contact with pass rolls 22, 23. The sheet 10 further advances downward continuously in contact with cutting means 24 and sheet fixing means 25. The cutting means 24 functions for cutting the light-sensitive layer 12 and protective layer 13 in the direction traversing the continuous light-sensitive sheet 10 in the stage mentioned hereinafter. The cutting means 24 preferably comprises a disc cutter 24a (i.e., circular cutter) and fixing means 24b which keeps the sheet 10 on its surface by vacuum when the protective film 13 and light-sensitive layer 12 on the base film 11 is cut. The disc cutter 24a runs on the continuous sheet 10 in the direction traversing the continuous Sheet 10. The fixing means 24 preferably has a groove on which the cutting procedure is performed, so that the cutter 24a is kept from damage which is caused by accidental contact between the cutter 24a and the fixing means 24b.

The next fixing means 25 functions for temporarily fixing on its surface the continuous light-sensitive sheet 10. The fixing means 25 has a heater 26 at its bottom. The fixing means 25 is so arranged to be capable of going up and down in the apparatus.

The apparatus further contains a protecting film removing system which comprises a roller 27 for providing an adhesive tape 28 which is used for removing the protective film 13 from the continuous light-sensitive sheet 0 and a roller 29 for collecting the adhesive tape 28 which has been employed for removing the protective film 13. The adhesive film-supplying roller 27 can be rolled, for instance, by the aid of a torque motor (not illustrated). The collecting roller 29 is preferably rolled in association with the roller 21 for providing the continuous light-sensitive sheet. Such association can be easily done, for instance, by placing the collecting roller 29 on the roller 21, as is shown in FIG. 2.

The adhesive tape generally comprises a support film (such as that made of polyethylene, polypropylene, cellulose, or the like) having a thickness of 0.03 to 0.1 mm and tacky material (such as Of rubber type, or of acrylic resin type) coated on the support film.

The adhesive tape 28 can be a wide tape such as that having a width approximately equal to the width of the continuous light-sensitive sheet 10. However, the adhesive tape 28 can be composed of two narrow adhesive tapes which are to be so arranged in parallel to each other as to adhere to both sides of the continuous sheet 10. In the latter case, an additional center adhesive tape can be employed in combination.

The protecting film removing system further contains a bar 30 and a dancer roll 31. The bar 30 is movable for pressing the adhesive tape 28 by its tip to the front end 10a of the continuous light-sensitive sheet 10 so as to press the front end 10a of the sheet against the bottom (corresponding to the position of heater 26) of the fixing means 26. The bar 30 is capable of withdrawing from the bottom to peel the protective film 13 from the light-sensitive sheet 10. The pressing and withdrawing of the bar 30 can be done by an actuating cylinder 32. The dancer roll 31 is arranged in a position to be kept in contact with the adhesive tape 28 on the path between the tip of bar 31 and the collecting roller 29.

Below the fixing means 25, a cutter 33 for cutting the light-sensitive sheet in the direction across the longitudinal direction of the continuous light-sensitive sheet 10. The cutter 33 preferably comprises a rotary cutter 33a and a fixed cutter 33b which act in combination to sharply cut the sheet 10. The fixed cutter 33b can be withdrawn when the fixing means 25 goes down.

The laminating system comprises means 34 (such as a combination of plural rolls, as illustrated in FIG. 2) for supplying the substrate 35 to the position just below the fixing means 25 and a couple of heat rollers 36 for laminating the base film (i.e., cover film) 11 and light-sensitive layer 13 on the substrate 35. The clearance between the heat rollers 36a, 36b can be adjusted by an air cylinder 37.

The procedure for preparing the light-sensitive material can be described with reference to FIGS. 2 to 6 in the attached drawings.

In the first place, the continuous light-sensitive sheet 10 is unrolled from the roller 21 to advance along the path in which pass rolls 22, 23, the cutting means 24, and the fixing means 25 are arranged in series, as is described hereinbefore.

Figure 3:
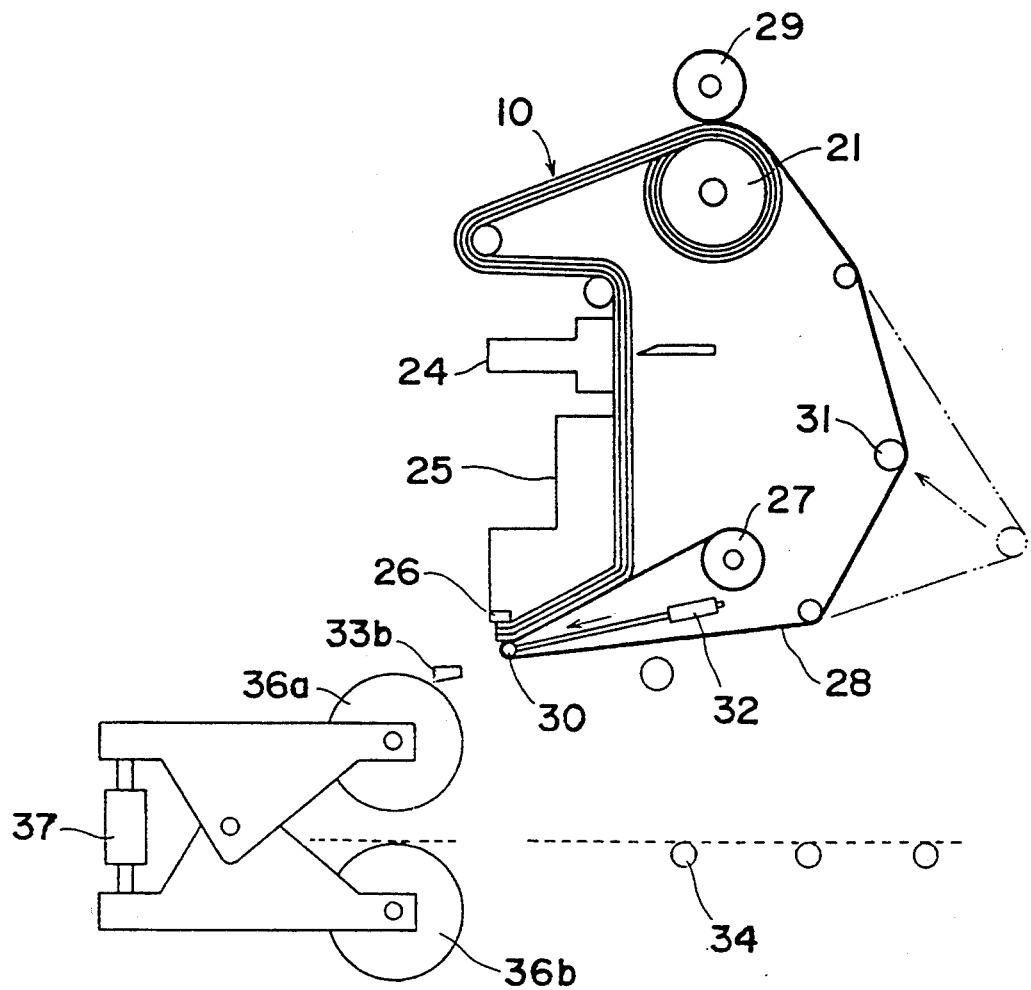
FIG. 3 shows the second stage of the process for preparing the light-sensitive material.

When the front end 10a of the continuous light-sensitive sheet 10 reaches the position near to the adhesive film-pressing bar 30, the pressing bar 30 is pushed forward by means of the cylinder 32. By this action of the pressing bar 30, the roller 27 is rotated to unroll the adhesive tape 28. Thus, the tip of the pressing bar 30 is brought into contact with the front end 10a of the sheet 10 and is further pushed forward to apply the front end 10a of the sheet 10 and the adhesive tape 28 to the bottom of the fixing means 25, namely, the position of the heater 26, as is illustrated in FIG. 3. In this stage, the dancer roll 31 is lifted up by the tension of the adhesive tape 28 which is caused between the tip of the pressing bar 30 and the roller 29, so that an excessive adhesive tape is unrolled. The front end 10a of the sheet 10 is then fixed temporarily to the heater position, for instance, by vacuum produced inside of the fixing means 25. In this stage, the fixed cutter 33b takes a position in which the cutter does not disturb the fixing procedure.

Figure 4:
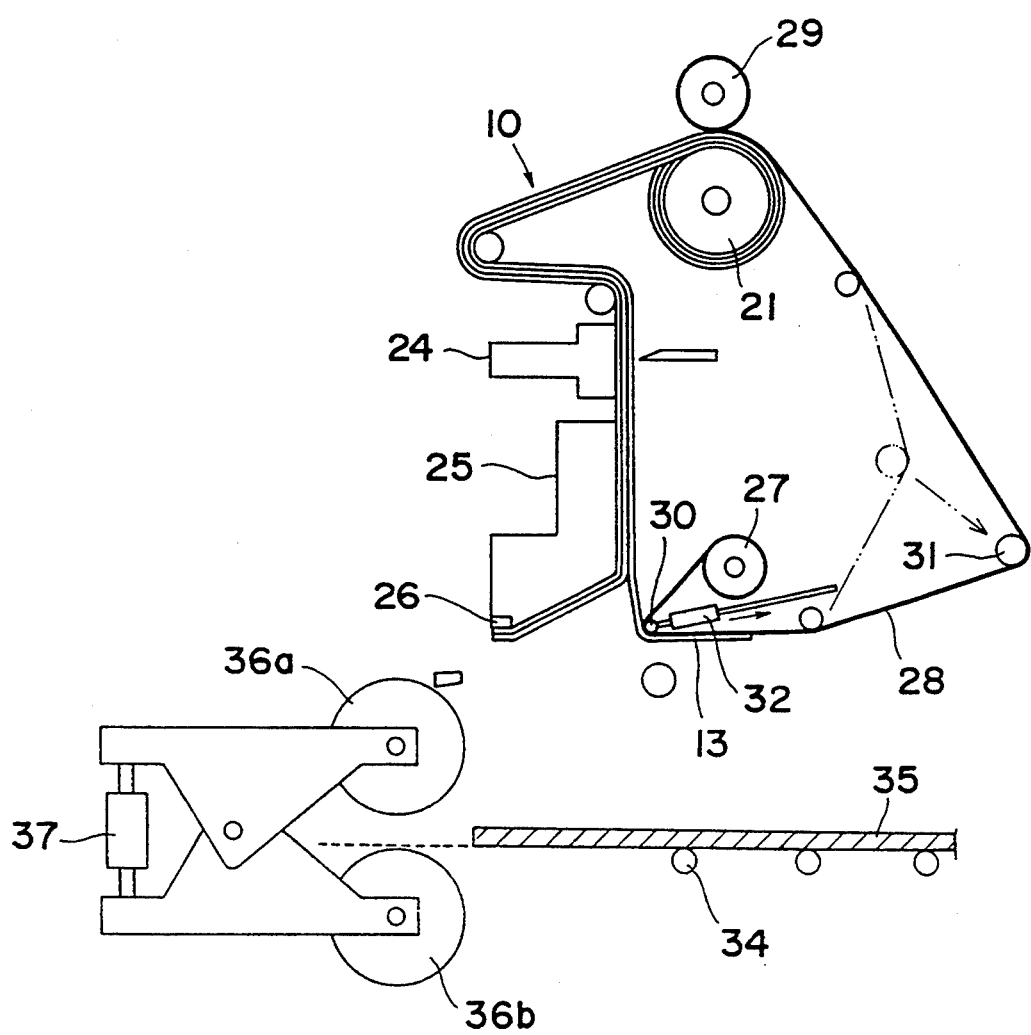
FIG. 4 shows the third stage of the process.

When the front end 10a of the sheet 10 is well fixed to the heater 26 of the fixing means 25, the pressing bar 30 is then withdrawn bymeans of the cylinder 32. The adhesive tape attached to the tip of the pressing bar 30 is also withdrawn by the tension given by the lifted dancer roll 31, and the dancer roll 31 goes down as is illustrated in FIG. 4. The protective film 13 which adheres to the adhesive tape is peeled from the surface of the light-sensitive layer 12 of the continuous light-sensitive sheet 10. Simultaneously, the substrate 35 is carried by the rollers 34 to reach the position just under the fixing means 25.

Figure 5:
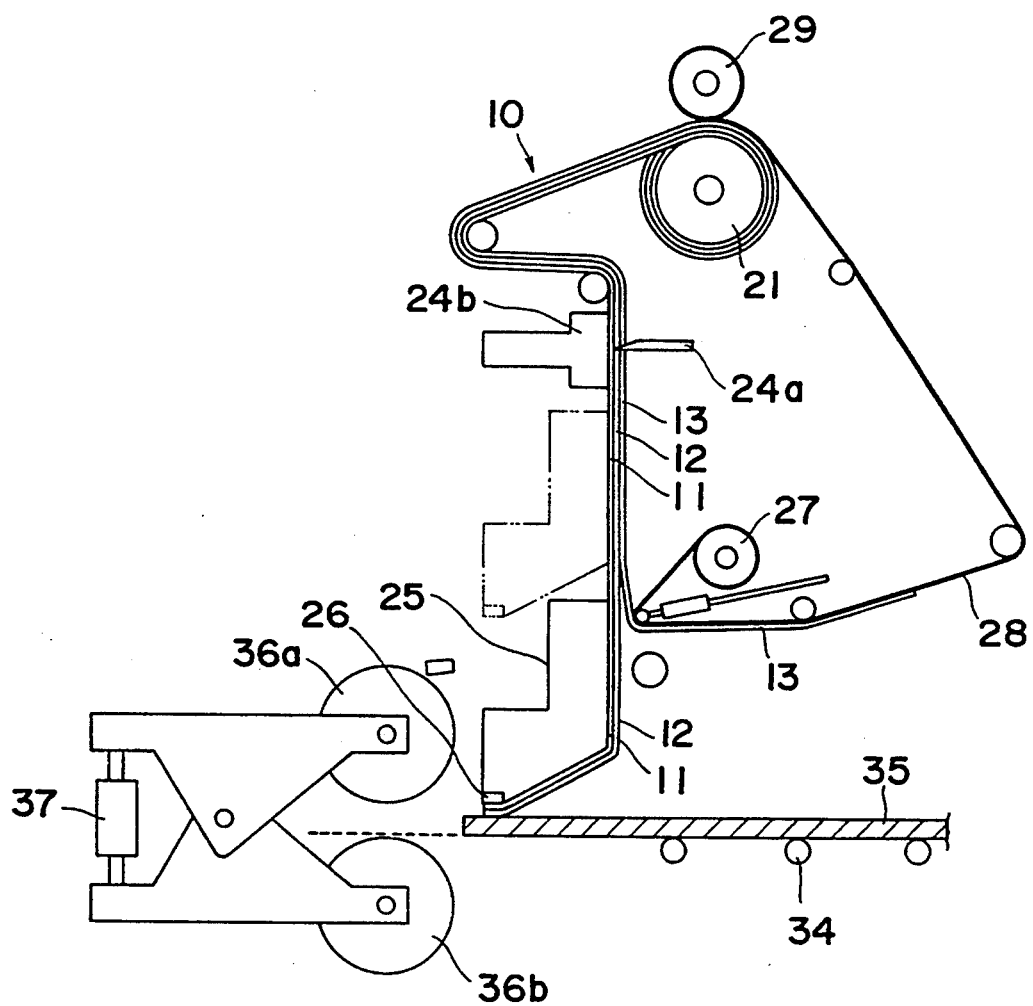
FIG. 5 shows the fourth stage of the process.

Subsequently, the fixing means 25 goes down so that the front end 10a of the sheet on the heater 27 is placed on the front end of the substrate 35, as is illustrated in FIG. 5. Thereafter, the heater 26 is heated to fix the front end of the sheet onto the front end of the substrate 35 via the light-sensitive layer 12. Simultaneously, the roller 29 is rotated to roll up the adhesive tape 28 to which the protective film 13 is attached. In this stage, the disc cutter 24a is placed on the protective film 13 of the sheet 10 to cut the protective film 13 as well as the light-sensitive layer 12 on the base film 11 in the direction traversing the continuous sheet 10 by the aid of the fixing means 24b.

Figure 6:
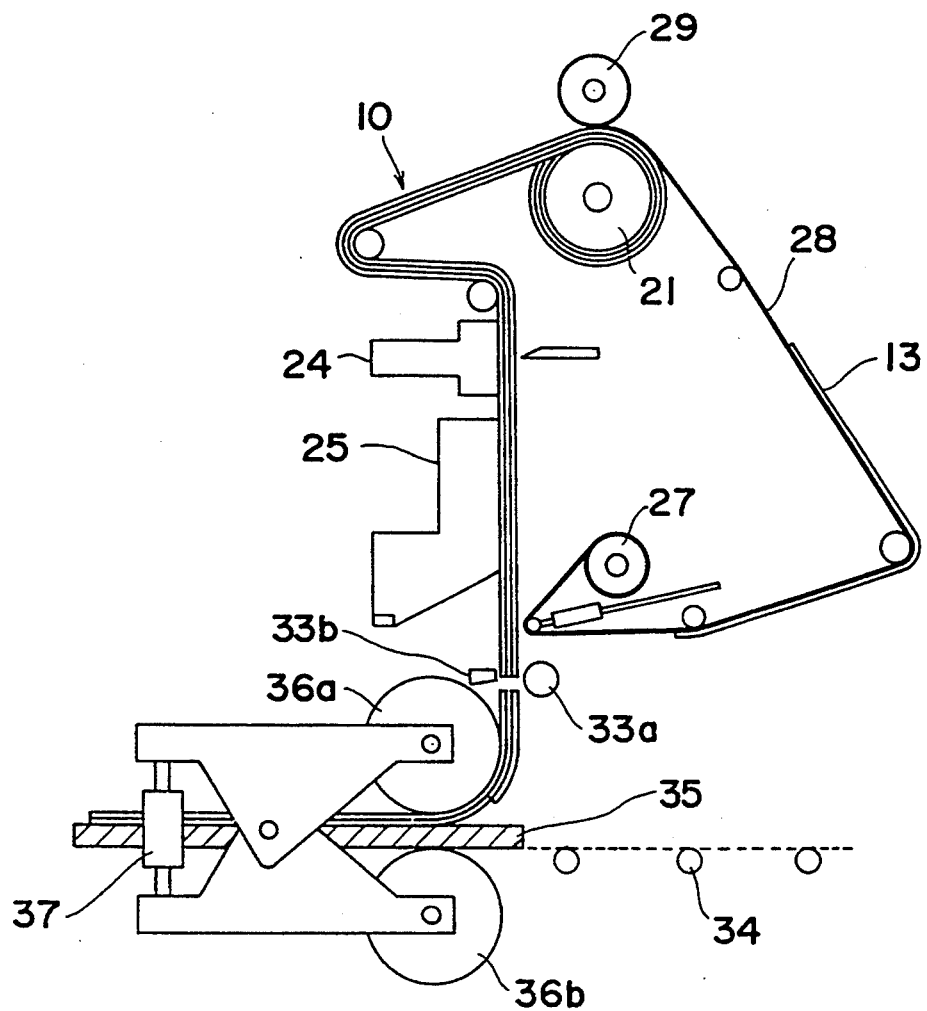
FIG. 6 shows the final stage of the process.

When the front end 10a of the continuous sheet 10 is well fixed on the front end of the substrate 35, the fixing means 25 goes up, and the heat rollers 36a, 36b are moved to receive the substrate 35 and the sheet 10 therebetween and are driven to sandwich the substrate 35 and the sheet 10 therebetween by the air cylinder 37. Thereafter, the composite of the substrate 35 and sheet 10 is driven to advance between the heat rollers 36a, 36b. When the rear end of the substrate 35 almost reaches the heat rollers 36a, 36b, the rotary cutter 33a and the fixed cutter 33b function in combination to cut the sheet 10 in the position covered by the protective film 13, as is illustrated in FIG. 6. The substrate 35 on which the light-sensitive layer 12 and the cover film (i.e., base film) 11 is laminated advances further to pass through the heat rollers 36a, 36b. Thus, the desired light-sensitive material is prepared.

The protective film attached to the adhesive tape 28 is finally peeled from the continuous sheet 10 and transferred to be rolled up by the roller 29. Alternatively, the peeled protective film can be removed from the adhesive tape 28 before it reaches the roller 29. The adhesive tape can be prepared in the form of an endless tape of loop type to continuously employ to remove the protective film from the light-sensitive sheet.

Figure 7:
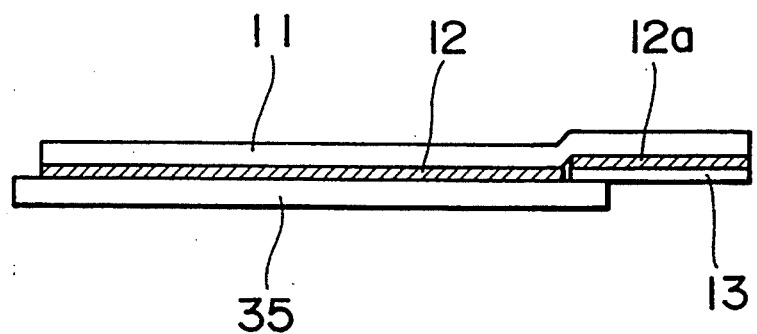
FIG. 7 shows a section of an example of the light-sensitive material which is prepared by the use of the system of the invention.
Figure 8:
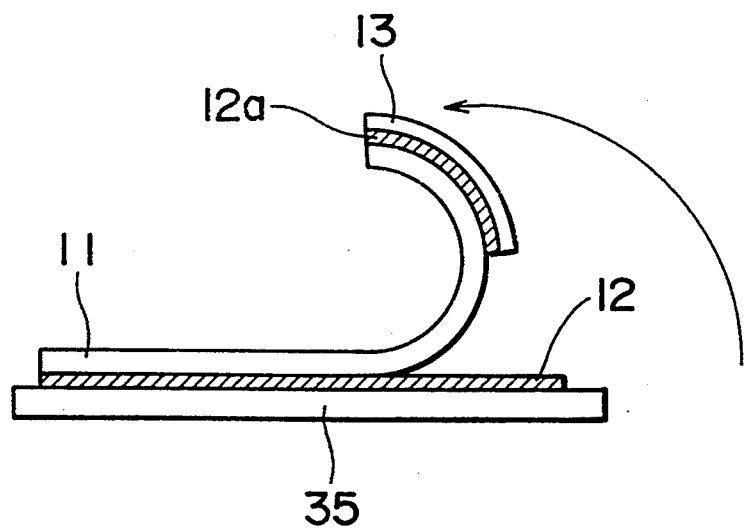
FIG. 8 shows a procedure of peeling the cover film from the light-sensitive layer of the light-sensitive material of FIG. 7 which is performed in advance of the exposure to light to form a image pattern.

FIG. 7 illustrates a schematic view of the section of the prepared light-sensitive material which comprises a substrate 35, a light-sensitive layer 12, and a cover film 11 (formerly, the base film of the continuous sheet 10). At the rear end on the substrate 35, a small piece of the protective film 13 is attached under the small portion 12a of the light-sensitive layer. This small piece of the protective film 13 serves as a tab to peel the cover film 11 off when the light-sensitive material 71 is employed for the image formation by exposure to light and development, as is illustrated in FIG. 8.

We claim:

1. A system for the preparation of a light-sensitive material comprising a substrate, a light-sensitive layer and a base film in order which comprises:
   a roller for providing a continuous light-sensitive sheet comprising the base film, the light-sensitive layer and a protective film;
   means for cutting the light-sensitive layer and protective layer in the direction traversing the continuous light-sensitive sheet which is supplied by the roller;
   fixing means for temporarily fixing thereto the continuous light-sensitive sheet, said means having a heater at its bottom and being capable of going up and down;
   a roller for providing an adhesive tape for removing the protective film from the continuous light-sensitive sheet;
   a roller for collecting the adhesive tape which has been employed for removing the protective film;
   a bar which is movable for pressing the adhesive tape by its tip to the front end of the continuous light-sensitive sheet so as to press the front end of the sheet against the bottom of the fixing means and for withdrawing to peel the protective film from the light-sensitive sheet;
   a dancer roll which is arranged in contact with the adhesive tape on the path between the tip of bar and the collecting roller;
   a cutter for cutting the light-sensitive sheet the direction traversing the continuous light-sensitive sheet which is supplied by the fixing means;
   means for supplying the substrate to the position below the fixing means; and
   heat rollers for laminating the base film and light-sensitive layer on the substrate.

2. The system of claim 1, wherein the means for cutting the light-sensitive layer and protective layer comprises a disc cutter and a means for temporarily keeping the light-sensitive sheet thereon.

3. The system of claim 1, wherein the roller for collecting the adhesive tape is capable of rolling in association With the roller for providing the continuous light-sensitive sheet.

4. The system of claim 1, wherein the bar has a tip of an acute angle which is to be brought into contact with the adhesive tape.

* * * * *